(12) United States Patent
Svasand et al.

(10) Patent No.: US 9,437,347 B2
(45) Date of Patent: Sep. 6, 2016

(54) METHOD FOR MANUFACTURING AN ELECTROSTATIC DISCHARGE DEVICE

(75) Inventors: Eldrid Svasand, Valparaiso (CL); Mark Buchanan, Oslo (NO); Matti Knappila, Drammen (NO); Geir Helgesen, Finstadjordet (NO); Arnulf Maeland, Royal Palm Beach, FL (US)

(73) Assignee: CONDALIGN AS, Kjeller (NO)

( * ) Notice: Subject to any disclaimer, the term of this patent is extended or adjusted under 35 U.S.C. 154(b) by 158 days.

(21) Appl. No.: 13/380,227

(22) PCT Filed: Jun. 22, 2010

(86) PCT No.: PCT/NO2010/000241
§ 371 (c)(1),
(2), (4) Date: May 17, 2012

(87) PCT Pub. No.: WO2010/151141
PCT Pub. Date: Dec. 29, 2010

(65) Prior Publication Data
US 2012/0224285 A1 Sep. 6, 2012

(30) Foreign Application Priority Data
Jun. 22, 2009 (NO) .................................. 20092381

(51) Int. Cl.
*H01B 1/24* (2006.01)
*H05K 9/00* (2006.01)

(52) U.S. Cl.
CPC .............. *H01B 1/24* (2013.01); *H05K 9/0079* (2013.01)

(58) Field of Classification Search
CPC .............. B29C 79/62; B29K 2105/18; B29K 2995/0013; H01G 4/206; H01B 1/24; H05K 9/0079

USPC ................. 29/592.1, 825, 846, 852; 264/437
See application file for complete search history.

(56) References Cited

U.S. PATENT DOCUMENTS 5,522,962 A * 6/1996 Koskenmaki et al. .... 156/272.4
5,700,398 A 12/1997 Angelopoulos et al.
(Continued)

FOREIGN PATENT DOCUMENTS

CN 101323173 A 12/2008
EP 1 867 464 A1 12/2007
(Continued)

OTHER PUBLICATIONS

The Extended European Search Report issued Mar. 27, 2013, in Application No. / Patent No. 10792384.9-1803 / 2446447 PCT/NO2010000241.
(Continued)

*Primary Examiner* — Carl Arbes
(74) *Attorney, Agent, or Firm* — Oblon, McClelland, Maier & Neustadt, L.L.P.

(57) ABSTRACT

The invention is achieved by applying a layer of the mixture that contains polymer and conductive particles over a first surface, when the mixture has a first viscosity that allows the conductive particles to rearrange within the layer. An electric field is applied over the layer, so that a number of the conductive particles are aligned with the field and thereafter the viscosity of the layer is changed to a second, higher viscosity, in order to mechanically stabilize the layer. This leads to a stable layer with enhanced and anisotropic conductivity that can be used in the manufacture of ESD devices.

18 Claims, 4 Drawing Sheets

(56) References Cited

U.S. PATENT DOCUMENTS

| | | | |
|---|---|---|---|
| 5,776,587 A | 7/1998 | Angelopoulos et al. | |
| 5,916,486 A | 6/1999 | Angelopoulos et al. | |
| 5,922,466 A | 7/1999 | Angelopoulos et al. | |
| 5,985,458 A | 11/1999 | Angelopoulos et al. | |
| 5,997,773 A | 12/1999 | Angelopoulos et al. | |
| 6,015,509 A | 1/2000 | Angelopoulos et al. | |
| 6,218,629 B1 | 4/2001 | Brofman et al. | |
| 6,504,524 B1* | 1/2003 | Gates et al. | 345/107 |
| 6,800,537 B2* | 10/2004 | Haba | 438/455 |
| 6,837,928 B1 | 1/2005 | Zhang et al. | |
| 7,112,267 B2* | 9/2006 | Whatmore et al. | 204/547 |
| 2001/0007288 A1 | 7/2001 | Brofman et al. | |
| 2003/0022945 A1 | 1/2003 | Bowers, Jr. et al. | |
| 2003/0102154 A1* | 6/2003 | Haba | 174/257 |
| 2004/0077733 A1 | 4/2004 | Bowers, Jr. et al. | |
| 2005/0195469 A1* | 9/2005 | Van Brocklin et al. | 359/296 |
| 2005/0206028 A1 | 9/2005 | Aisenbrey | |
| 2007/0238826 A1 | 10/2007 | Fischer et al. | |
| 2008/0036123 A1 | 2/2008 | Fischer et al. | |
| 2008/0039569 A1 | 2/2008 | Asdal et al. | |
| 2008/0102266 A1* | 5/2008 | Nakatsuka et al. | 428/320.2 |
| 2009/0038832 A1 | 2/2009 | Chaffins et al. | |
| 2009/0288697 A1 | 11/2009 | Shimizu et al. | |
| 2009/0301769 A1 | 12/2009 | Seppä et al. | |
| 2010/0006141 A1* | 1/2010 | Oikawa et al. | 136/251 |
| 2011/0102697 A1* | 5/2011 | Koyama et al. | 349/43 |
| 2012/0145315 A1* | 6/2012 | Knaapila et al. | 156/273.9 |
| 2012/0224285 A1* | 9/2012 | Svasand et al. | 361/56 |
| 2012/0231178 A1* | 9/2012 | Svasand et al. | 427/532 |
| 2012/0240992 A1* | 9/2012 | Svasand et al. | 136/256 |
| 2012/0248448 A1* | 10/2012 | Sakakura et al. | 257/59 |

FOREIGN PATENT DOCUMENTS

| | | |
|---|---|---|
| EP | 2 058 868 A1 | 5/2009 |
| JP | 2004-327292 A | 11/2004 |
| JP | 2005-306992 A | 11/2005 |
| JP | 2007-332224 A | 12/2007 |
| WO | WO 03/009927 A1 | 2/2003 |
| WO | WO 2006/026691 A2 | 3/2006 |
| WO | WO 2006/052142 A1 | 5/2006 |
| WO | WO 2008/009779 A1 | 1/2008 |
| WO | WO 2009/053470 A1 | 4/2009 |

OTHER PUBLICATIONS

Japanese Office Action issued Aug. 6, 2013 in Patent Application No. 2012-517432 with English Translation.

International-Type Search Report issued Mar. 17, 2010 in patent application No. NO 20092381.

International Search Report issued Sep. 20, 2010 in patent application No. PCT/NO2010/000241.

Matthias-Klaus Schwarz, et al., "Alternating electric field induced agglomeration of carbon black filled resins", Polymer, Elsevier Science, ltd., vol. 43, No. 10, XP004343311, May 1, 2002, pp. 3079-3082.

Eldrid Svasand, et al., "Behavior of carbon cone particle dispersions in electric and magnetic fields", Colloids and Surfaces A: Physicochemical and Engineering Aspects, vol. 339, No. 1-3, XP026076590, May 1, 2009, pp. 211-216.

Eldrid Svasand, et al., "Chain formation in a complex fluid containing carbon cones and disks in silicon oil", Colloids and Surfaces A, Physiochemical and Engineering Aspects, vol. 308, 2007, pp. 67-70.

Combined Office Action and Search Report issued Oct. 29, 2013 in Chinese Patent Application No. 201080033253.9 (with English language translation).

* cited by examiner

METHOD FOR MANUFACTURING AN ELECTROSTATIC DISCHARGE DEVICE

This application is a 371 of PCT/NO2010/000241, filed Jun. 22, 2010. Priority to Norwegian patent application 20092381, filed Jun. 22, 2009, is claimed.

TECHNICAL FIELD

The invention concerns conductive and dissipative electrostatic discharge (ESD) devices, also known as antistatic devices and a method for manufacturing them, using conductive paths of low-cost particles in a curable nonconductive matrix.

BACKGROUND OF THE INVENTION

When two objects of dissimilar materials are rubbed together electrons are transferred from one material to the other through the process of triboelectrification. The objects become statically charged with one material accumulating positive charge and the other material accumulating negative charge. The process of safely discharging electrostatic charges or preventing or minimizing their occurrence, e.g. in a manufacturing or workplace environment, is accomplished through ESD devices. These devices have the effect of reducing static electricity charges on a person's body or equipment, for example to prevent fires and explosions when working with flammable liquids and gases, or to prevent damage to static-sensitive objects such as electronic components or devices.

The term Electrostatic discharge (ESD) device as used here includes conductive and dissipative devices, films and adhesives There are many standards relating to ESD. The ESD Association (www.esda.org) has published 35 standards covering ESD in the electronics environment. CENELEC has issued a European electrostatic standard EN100015—Protection of Electrostatic Sensitive Devices.

ESD devices have many areas of use, such as:

ESD packaging devices including films, bags, and rigid structures used to contain devices, such as graphics cards or hard disk drives under transport or storage. Such films can also be used in the production of batteries or capacitors, forming a conductive barrier inside the battery or capacitor.

ESD garment devices such as clothes and shoes, used in many workplaces.

ESD agents or compounds used for treatment of materials or their surfaces in order to reduce or eliminate build-up of static electricity ESD mats and floors, ranging from small mats for keyboards and mice and larger mats or entire floors ESD workstations and work surfaces provide an electrical path to ground for the controlled dissipation of any static potential on materials that contact the surface.

ESD parts such as gaskets.

The terms conductive and dissipative can broadly be defined as:

Conductive: Materials with a resistance of between 1 kΩ and 1 MΩ

Dissipative: Materials with a resistance of between 1 MΩ and 1 TΩ

The Electrostatic Discharge Association's document ESD ADV1.0-2009 provides the following definitions applicable in the current context:

conductive material, resistivity: A material that has a surface resistivity less than 1×10E5 ohms/square or a volume resistivity less than 1×10E4 ohm-cm.

conductive material, resistance: A material that has a surface resistance of less than 1×10E4 ohms or a volume resistance of less than 1×10E4 ohms.

conductive flooring material: A floor material that has a resistance to ground of less than 1.0×10E6 ohms.

dissipative floor material: Floor material that has a resistance to ground between 1.0×10E6 and 1.0×10E9 ohms.

dissipative materials: A material that has a surface resistance greater than or equal to 1×10E4 ohms but less than 1×10E11 ohms or a volume resistance greater than or equal to 1×10E4 ohms but less than 1×10 μl ohms.

The present invention concerns conductive and dissipative ESD devices, and we use the common term ESD device for these. The term "antistatic" is also a common synonym for "electrostatic discharge", e.g. used in "Antistatic device" as a synonym for ESD device; i.e. we use the term ESD device as equivalent to antistatic device.

In the production of such conductive and dissipative devices like antistatic films and bags, shoes, mats and floors, polymers are well suited for use at the outer surface. Other materials that similarly can change viscosity during production are also suited. The materials are manufactured into a film or a sheet which can be laminated or a liquid coating which can be sprayed on or the device dipped in, and then cured by spontaneous reaction of the material, or accelerated by the use of e.g. heat or UV light Electrically conductive polymer containing materials can be based on the mixture of a polymer matrix and conductive particles (fillers) embedded into this matrix, or inherently conductive polymers.

Electrically conductive or dissipative polymer materials which are of interest to this invention are based on the mixture of a nonconductive polymer matrix and conductive particles (fillers) embedded into this matrix; Inherent conductive polymers are also known and alloyed with nonconductive polymers can form conductive or dissipative materials.

The addition of filler changes some of the bulk properties of the polymer matrix. These changes are frequently undesirable, e.g. a decrease in material strength and transparency and change in colour. It is important to lower the filler content to minimize these effects.

In the present invention the polymer matrix can be an adhesive and the electrically conductive particles; metal, metal oxides, metal-colloid particles, or carbon particles such as carbon nanotubes (CNTs). The materials can also be directionally conductive.

The electrically conductive or dissipative polymer films are usually produced by mixing the filler material with a polymer resin and in order to have a conductive mixture the amount of filler material must exceed the percolation threshold. Mixed systems have limited lifetime and must be re-mixed prior to use. A common problem is that a film or layer even when manufactured to a uniform thickness, will have non-uniform conductivity because the filler material will not distribute evenly. The problem is well-known in polymer physics and stems from the mutual incompatibilities of filler materials and polymer matrix, which means that only small amount of fillers can be mixed with the matrix to lead to the stable mixture. Higher amounts will macrophase separate with time. Therefore, this problem is fundamental in nature. Moreover, the mixing process applied for higher filler quantities must be so vigorous that the filler particles may get broken.

U.S. Pat. No. 4,269,881 and U.S. Pat. No. 5,348,784 teaches the production of carpet products where conductive fibres are mixed into the base of an adhesive. U.S. Pat. No. 4,724,187 teaches the similar for conductive laminate flooring.

US2005/0206028A1 teaches electrically conductive flooring formed of a conductive loaded resin-based material that comprises micron sized conductive powder, conductive fibre or a combination in 20% to 50% by weight of the total conductive resin. WO2010018094A2 teaches a similar invention for a substrate-free conductive surface.

U.S. Pat. No. 4,101,689 teaches an electrically conductive floor covering comprising a sheet of a thermoplastic synthetic resin, substantially non conducting, said sheet having a plurality of holes penetrating there through and electrically conductive material filling said holes.

U.S. Pat. No. 4,944,998 teaches a surface covering vinyl floor tile product having static dissipative electrical properties and a method of producing the same.

U.S. Pat. No. 7,060,241B2 discloses an electrically conductive film using single-walled CNT giving conductivity and transparency. The CNT can be oriented by exposing the films to a shearing step.

In order to increase signal transmission capability or dissipative discharge without having to increase the amount of conductive filler material, conductive films can be made anisotropic.

Anisotropic films can also be designed so that they have insulating properties in certain directions.

In EP 1809716 is described a method for making a directionally conductive adhesive based on CNTs. A tape having an insulation base and a parallel arrangement of CNTs acting as electrical contact points is made by growing carbon CNTs on a material used in the tape or arranging CNTs on the tape before adding the adhesive part to the tape.

In U.S. Pat. No. 5,429,701 is described how electric interconnection between discreet individual conductors of soft magnetic metal in two layers is achieved by adjoining the conductors by a conductive adhesive. The adhesive have particles of soft magnetic metal and by applying a magnetic field the particles can be gathered in an area between the conductors.

It is known that dipolar rigid asymmetric particles or molecules can be aligned by an electric field; this is especially used for small molecular weight liquid crystals.

In these cases the material having permanent dipole moments is fluid under normal conditions, a fact which makes electric field alignment possible.

Aligned structures of infusible conductive carbon particles, like CNTs, are known to be formed by chemical vapour deposition or spinning.

A method for the directional growth of CNTs is shown in U.S. Pat. No. 6,837,928. CNTs are grown in an electric field which directs their growth and thus leads to aligned CNTs when the growing procedure is completed.

Mixing of CNCs with diverse materials has been described in document WO2006052142. In this description CNCs form isotropic mixture with the matrix.

In document WO2008009779 electric field is used to induce sintering in nanoparticle coating.

Electric field alignment of carbon nanocone (CNC) material has been demonstrated in Svåsand et al. Colloids & Surf A Physicochem. Eng. Aspects 2007 308, 67 and 2009 339 211. In these articles it, is shown that nanocone material dispersed in silicon oil can form micron size nanocone "fibres" when a field of minimum 50 V/mm is applied. In order to form fibres within a reasonable time, fields of 400V/mm are used.

In Schwarz et al. Polymer 2002, 43, 3079 "Alternating electric field induced agglomeration of carbon black filled resins" it is reported how carbon black filled resins below zero-field percolation threshold can form electrically conductive networks when a field of 400 V/cm is applied between copper electrodes dipped into the resin.

US 20090038832 describes a method for forming an electrical path having a desired resistance from carbon nanotubes dispersed in a curable polymer matrix. Electrodes are placed in contact with the dispersion and electrical energy is applied to the carbon nanotubes until the desired electrical resistance is reached. A pure semi-conducting connection can be achieved by burning away metallic nanotubes that may be part of the carbon nanotube mixture, by applying a current after the deposition. The polymer matrix is cured in order to fix the device.

A disadvantage with prior art is that carbon nanotubes are very expensive and difficult to produce on an industrial scale. A dispersion of nanotubes is difficult to store and require specific manufacturing steps like homogenation or sonication prior to application of the dispersion to the substrate. The process of making holes in the polymer matrix to be filled by conductive materials as described in U.S. Pat. No. 4,101,689A is also complicated.

There is, therefore, a need for a more cost effective manufacturing method giving devices, films and adhesives with uniform conductivity and improved mechanical and optical properties.

LIST OF DRAWINGS

FIG. 5a-c depicting aligned and cured conductive nanocone adhesives in in-plane geometry.

Figure 6:
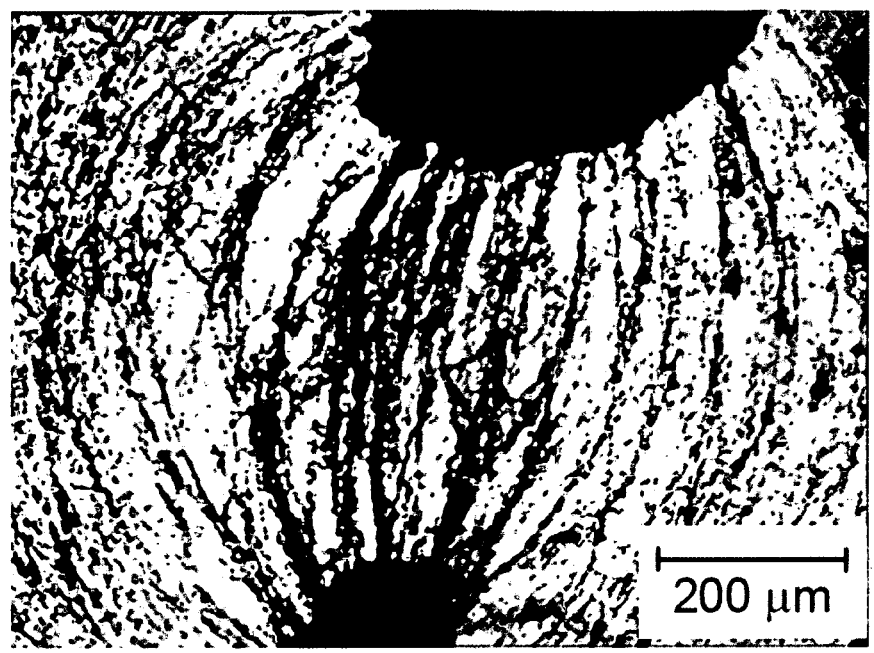

FIG. 6 shows aligned material with arbitrary alignment geometry and arbitrary electrode shape.

Figure 7:
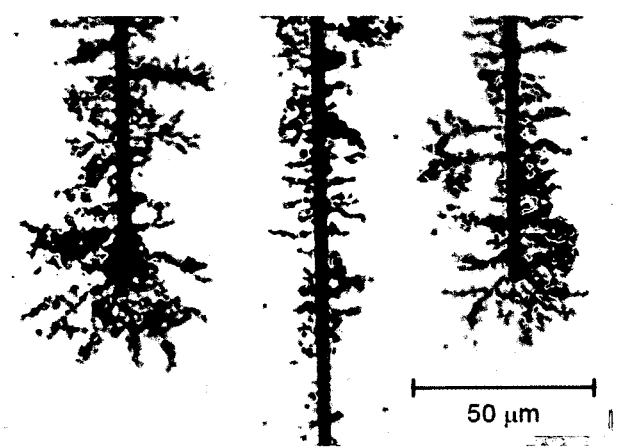

FIG. 7 illustrates "dendritic" structures maximizing the contact area between conductive item and matrix.

DESCRIPTION OF THE INVENTION

The invention provides for a method for forming an anisotropic conductive or dissipative film comprising a nonconductive matrix mixed with conductive particles.

The present invention may be used both in a device, film or adhesive to t avoid buildup of electrostatic charges and for a device which safely discharges if a person or object has been electrostatically charged.

The conductive particles are infusible particles such as carbon particles or metal particles. The conductive particles show low molecular or particle anisotropy which is the case with spherical carbon black or disk-like carbon particles. The major part of the conductive particles thus has low aspect ratio; aspect ratio ranges of 1-4, or 1-5, 1-10, 1-20 or 1-100 are typical. The conductive particles can be a mixture of different carbon particles. Also other conductive particles can be used. Metal, like silver, or metal oxide particles can be used.

The matrix can be a polymer system of any kind and it can contain one or several components. In particular, it can be a thermoset polymer system which means that the matrix is originally fluid, but can be solidified by cross-links. This polymer can be an adhesive. It can also be a thermoplastic polymer system which means that the polymer is solid or viscous at lower temperatures but can be reversibly melted or plasticised by increasing the temperature. It can moreover be a lyotropic polymer system which means that the matrix can be plasticised by solvent and solidified by evaporating this solvent off. It may then have a high percentage of filler material with low price, usable for production of large volume ESD devices, such as floor tiles. It can also be any combination of these systems. For example, the thermoset polymer system can contain solvent for plasticizing it but the stabilization can be based primarily on cross-linking and only secondarily on the solvent evaporation.

An element of the invention is that conductive paths can be formed of low molecular anisotropic particles like carbon black and disc like carbon particles at low electric field strengths. This simplifies the production equipment and enables both larger surfaces and thicker films to be produced. The carbon black and disc like carbon particles are considerably cheaper than the carbon nanotubes (CNT) and can be produced in large quantities by industrial methods.

Another element of the invention is that the amount of conductive particles may be below the percolation threshold. This has several advantages in that mixtures having only small amounts of conductive particles are less prone to macrophase separation and are thereby easier to store. Also the mechanical strength of the anisotropic conductive film can be increased if the amount of particles can be reduced. For UV cured films the curing process is more effective when the amount of shielding particles is lower. Likewise the transparency of a film can be increased if the amount of particles can be reduced. A lower amount of conductive particles is also a cost-saving element.

The electric field can be created between electrodes that can be placed either in direct contact with one or both sides of the layer or outside additional insulating layers, where the insulating layers are placed in contact with the first layer; or that may not be in direct contact with the layer.

The direction of the electric field can be predetermined by the electrode arrangement and thereby the direction of the electric connections formed by the aligned conductive particles can be controlled.

The ESD degree can be controlled in the production, by varying factors such as the particle mix and the field. The electric field can be in the order of 0.01 to 35 kV/cm, in the order of 0.05 to 20 kV/cm, or 0.05 to 5 kV/cm or 0.1 to 1 kV and especially in the order of 0.1-1 kV/cm.

This means that for a typical alignment distance in the range of 10 μm to 1 mm, the voltage applied can be in the range of 0.1 to 100 V. The field is an alternating (AC) field, but can also be a direct (DC) electric field. A typical field is an AC field having a frequency of 10 Hz to 100 kHz, typically 10 Hz to 10 kHz. Very low frequencies <10 Hz or DC fields lead to asymmetric chain formation and build up. The low voltage needed for applying the method is simple to handle in a production line and does not need the specific arrangements necessary when handling high voltages.

Thus, the present invention is based on the finding that it is possible to align conductive particles in fluid-like polymer matrices using an electric field to form conductive pathways in the fluid-like polymer matrices. The pathways are able to enhance the macroscopic conductivity of the material. In particular, the formation of conductive pathways allows the material to become conductive also when it contains a lower amount of conductive particles than is otherwise necessary for creating electrical contact for the material having randomly distributed particles. The amount of conductive particles in the polymer matrix could thereby be reduced and can be up to 10 times lower than the percolation threshold, or even lower.

Moreover, this procedure renders anisotropic material and directional conductivity that is higher along the alignment direction than perpendicular to it.

It is also possible to heal aligned conductive particle pathways, if the conductive pathways have become defective or not properly aligned in the first step, the alignment step can be rerun for the case that the stabilization step of the matrix is not yet performed or if the stabilization step is reversible. This has the advantage that for existing films under preparation of the connections, the process needs not to be started afresh.

It is possible to remove most or all the matrix after alignment to yield distinctive, aligned molecular wires of the conductive particles. The removal can be done for example by excess heating (e.g. pyrolysis) or by chemical treatment (e.g. selective solvent).

The manufacturing of anisotropic conductive films does not require that the film forming resin is in contact with the electrodes. The manufacturing process can be conducted in a continuous way or step-wise. The anisotropic film can be attached to a substrate or be a free-standing film.

A conductive film of the present invention will have conductive pathways and thus may be used as an electrical current collector and connect to other films, which could be conductive or non-conductive. As electron flow can be unidirectional or bidirectional, the present invention can be used as anode or cathode in batteries or capacitors. The film can be laminated to other material by a heat lamination process, heat sealed to another non-conductive polymer, or laminated using a conductive binder. Another use is as a barrier to block electrolyte transfers or as a replacement for any battery metalized electrode conductor in electrolyte solutions of any sort.

In an embodiment of the invention the resin is removed fully or partly from the film after the anisotropic conductive film has been manufactured and a substrate with free standing conductive paths is achieved.

In another embodiment the polymer is used as an adhesive or in a lamination process.

DETAILED DESCRIPTION OF THE INVENTION

The present invention will be described below with reference to examples and figures. It is to be understood that the present invention is by no means limited to these examples and figures.

The method of the present invention is for manufacturing an ESD device which has at least one anisotropic conductive layer comprising a mixture of a matrix and conductive particles.

The steps are:
a. applying a layer of the mixture over a first surface of the ESD device, the mixture having a first viscosity which allows the conductive particles to rearrange within the layer;

b. applying an electric field between two alignment electrodes, over the layer, so that a number of the conductive particles are aligned with the field, thus creating conductive pathways;
c. changing the viscosity of the layer to a second viscosity, said second viscosity being higher than the first viscosity in order to mechanically stabilise the layer and preserve the conductive pathways.

Note that the first surface could be used as an alignment electrode, so there is no need to use a separate electrode. The electrodes may also be remote and thus insulated from the mixture.

The method can be performed in a production line for ESD devices; the production line may comprise the steps:
i. Polymer resin is mixed with CB according to the present invention to form a matrix
ii. the matrix is formed to a film, or an object is dipped in the matrix or it is sprayed on or poured over
   a. for films the layer has a thickness from 0.1 to 5 mm, preferably less than 3 mm.
   b. for thin mats the layer has up to 3 cm in thickness, preferably less than 2 cm in thickness
   c. for thick mats the layer has up to 50 cm in thickness, preferably less than 5 cm in thickness
iii. an electrical field according to the present invention is applied
iv. the matrix is cured, using e.g. UV light or heat
v. optionally the matrix is reduced, so as to expose the conducting pathways
vi. optionally steps ii to v is repeated The method can also be performed in a production line where a conductive layer or wires are to be connected or laminated. The production line may comprise the steps:
i. epoxy is mixed with CB according to the present invention to form a matrix
ii. the matrix is formed to a film or paste and used as glue where conductivity between layers or components or wires are wanted
iii. an electrical field according to the present invention is applied
iv. the matrix is cured, using e.g. UV light or heat Example 1

This example concerns the preparation of a mixture of conductive particles and polymer matrix which is a thermally cured polymer adhesive. It also shows the conductivity as a function of particle load and how the step-like increase in conductivity with increasing particle load can be explained by formation of conductive paths between particles when the contacts are formed with increased particle fraction.

This example concerns moreover the preparation of the same mixture when the particle load is low, for example 10 times less than the observed percolation threshold, the limit where the isotropic non-aligned mixture is not conductive; as well as the alignment of this mixture using electric field so that the aligned particles form conductive paths resulting in a conductive material, whose conductivity is directional, for example below the percolation threshold of non-aligned material. The example, moreover, shows the change of the viscosity of the resulting material obtained, for instance by curing, so that the alignment and directional conductivity obtained in the alignment step is maintained.

The employed conductive particles were CB from Alfa Aesar, CNC material from n-Tec AS (Norway) and iron oxide ($FeO.Fe_2O_3$) from Sigma-Aldrich.

The employed polymer matrix was a two component low viscosity adhesive formed by combining Araldite® AY 105-1 (Huntsman Advanced Materials GmbH) with low viscosity epoxy resin with Ren® HY 5160 (Vantico AG).

The conductive particles were mixed in the adhesive by stirring for 30 minutes. Due to the high viscosity of mixture, efficient mixing is possible only up to 20 vol-%.

Estimated percolation thresholds of these materials are at ~2 vol-%. The mixtures are conductive above and insulators below this threshold. The conductivity is due to the conductive particles and the polymer is an insulator.

To illustrate the benefit of alignment, the materials were the same and similarly prepared as in above but ten times lower particle loads were used.

Figure 1:
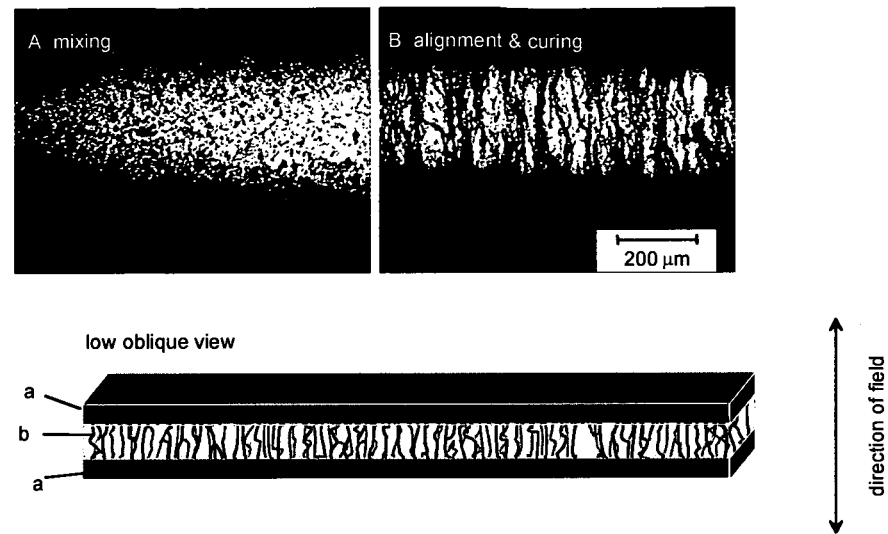
FIG. 1 shows optical micrographs of conductive particle assemblies before and after alignment.

FIG. 1 illustrates, using optical micrographs, the mixing of assemblies of 0.2 vol-% CNC particles dispersed into the example adhesive before (FIG. 1A) and after an electric field alignment and curing (FIG. 1B).

The scheme shows the applied alignment (out-of-plane) geometry (FIG. 1C). This alignment geometry was used to cover conductive path distances from 10 μm to centimeters, preferentially to millimeters. For an out-of-plane alignment 2 mm×3 cm wide layer of material is injected between two conductive layers (a).

Mixture was aligned using an AC source to obtain aligned pathways (b). In this example the alignment procedure 1 kHz AC-field (0.6-4 kV/cm (rms value)) was employed for 10 minutes for >1 mm electrode spacing and <10 minutes for <1 mm electrode spacing.

Figure 2:
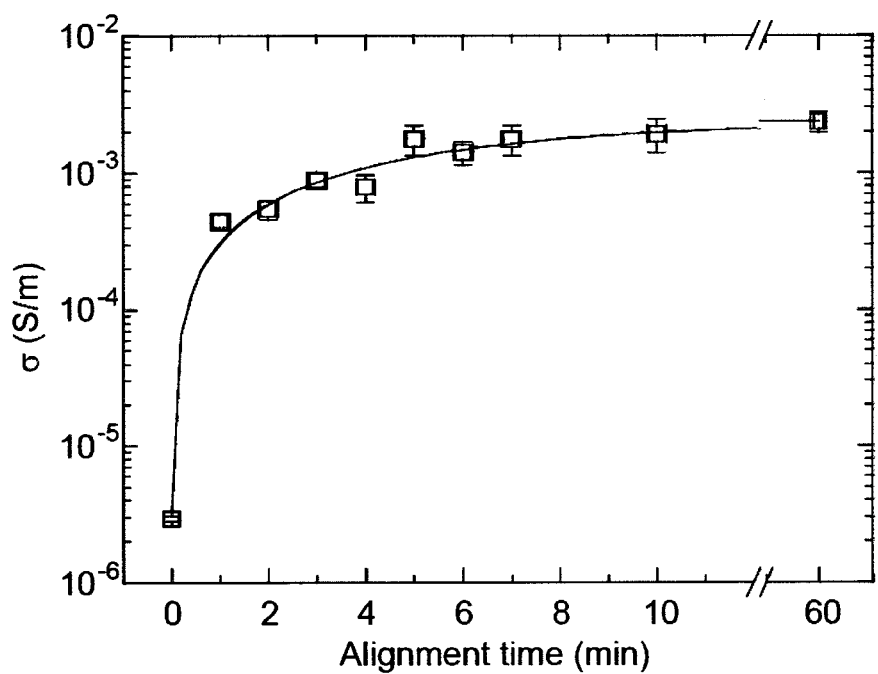
FIG. 2 shows a plot of the dependence of DC conductivity of 0.2 vol-% CNC particles dispersed into the adhesive against the alignment time. The solid line is guide to eye.

The dependence of DC conductivity of 0.2 vol-% CNC particles dispersed into the adhesive against the alignment time is shown in FIG. 2. The solid line is guide to eye. The curing was performed immediately afterwards at 100° C. for 6 minutes.

The material remains aligned after curing and conductivity level obtained by alignment is maintained.

Example 2

This example concerns versatile choice of alignment conditions and illustrates how the present invention can be employed not only with electrodes connected to the orientation material but also with electrodes electrically isolated from the material.

The procedure was otherwise similar to that in example 1, but instead of having material directly connected to the alignment electrodes, the electrodes were electrically disconnected from the material by an insulating layer, for example by 0.127 mm Kapton® foils. Alignment occurred exactly as in example 1.

Figure 3:
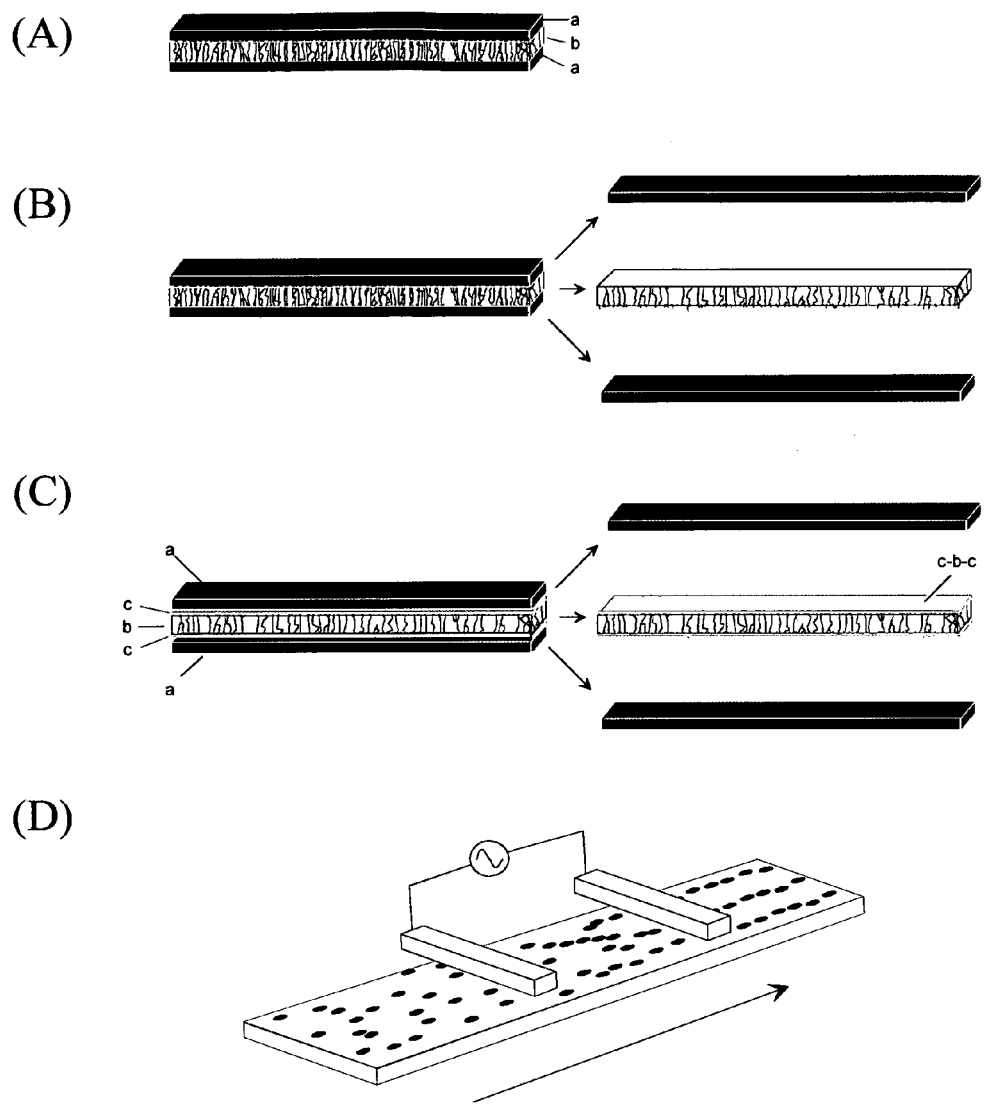
FIG. 3 shows aligned film with (A-B) and without (C-D) electrical contacts between electrodes (a) and material (b).

This procedure allows removal of electrodes after alignment and thus freestanding aligned film even in the case where the matrix is adhesive. The alignment also occurs if the electrodes do not touch the material and so the alignment can be performed from a distance. When the material and electrodes are moved, continuous or stepwise, with respect to each others during the alignment, this allows continuous alignment processing. Three possible options for the alignment settings are illustrated in FIG. 3 that shows aligned film with (A-B) and without (C-D) electrical contacts between electrodes (a) and material (b). In the case (A) the aligned film forms permanent connection between the electrodes. In the case (B) the electrodes and material are only loosely joined together and can be moved apart after alignment. In the case (C) there are insulating layers (c) between the material and electrodes and they are easily moved apart after the alignment even in the case where the material is an adhesive. In this case the obtained material is a multilayer consisting of aligned layer (b) and two insulating layers (c) In the case (D) the alignment is carried out from the distance and the mutual location of electrodes and film can be additionally moved during the alignment.

Example 3

This example concerns the applicability of the alignment method, the use of alignment for particular application of UV-curing. This emphasises the benefit of low particle fraction which makes the material better transparent for UV light for curing.

The procedure was otherwise similar to that in example 1 or 2 but the thermally cured polymer matrix was replaced by UV-curable Dymax Ultra Light-Weld® 3094 adhesive and the curing step was done by the UV-light with the wavelength 300-500 nm.

Figure 4:
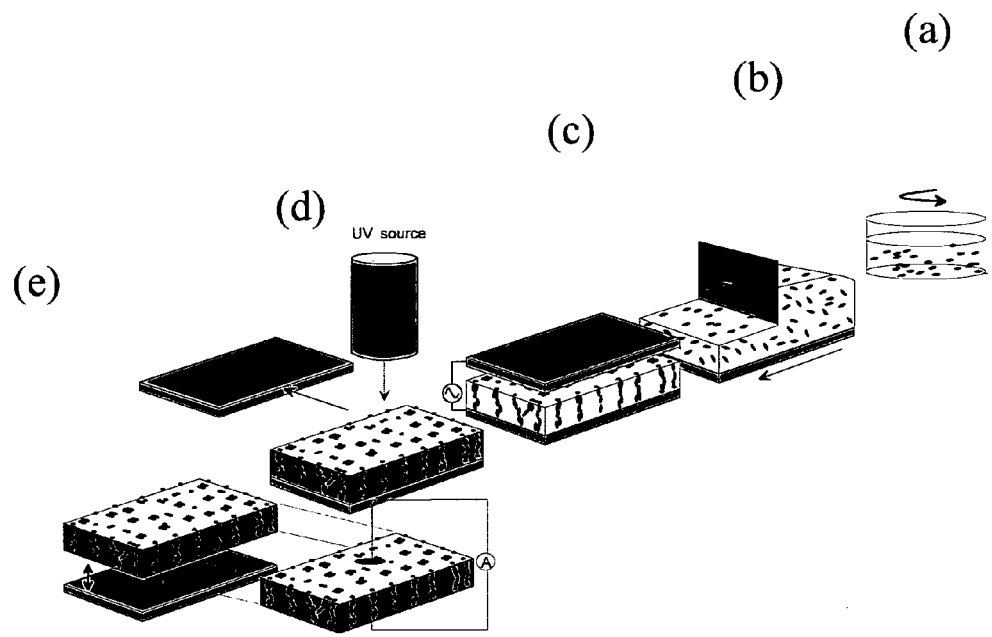
FIG. 4 shows schematics of the UV curing technique.

FIG. 4 illustrates the alignment of 0.2 vol-% CNC dispersion in out-of-plane geometry. The mixture was formed following the guideline of example 1 (FIG. 4a) but spread on the alignment electrode using RK Print Paint Applicator that uses a moving bird applicator to level the adhesive layer to the predetermined thickness (the idea is schematically illustrated in FIG. 4b). This admixture was aligned following the method outlined in example 2 but the upper electrode was not in contact with the material by use of an insulating layer such as Kapton (FIG. 4c); this allows removal of electrodes after alignment and thus freestanding aligned film even in the case where the matrix is adhesive. After alignment, the upper alignment electrode is removed and aligned admixture cured by UV or blue light. (FIG. 4d). The lower electrode can be optionally removed (FIG. 4e) to form a fully freestanding film.

FIG. 4 also gives the schematics of UV curing. Conductive particles are dispersed with UV-curable polymer matrix (a). This mixture is spread to form a predetermined layer on the substrate (that acts also as an alignment electrode) using an applicator (b). The material is aligned by electric field using lower electrode and another top-electrode that does not touch the material (c). The upper electrode is removed and the aligned mixture is cured using a light (UV/vis) source, which leads to a semi-freestanding aligned film (d). If required, the lower electrode can be additionally removed leading to a fully free-standing aligned film (e).

Example 4

This example concerns versatile choice of alignment geometries and illustrates how the invention can be employed not only in the geometry shown in example 1 but also in (i) thin films and (ii) in-plane geometry. This example underlines the generality of the method.

The material was the same and the procedure similar as in example 1, but instead of out-of-plane alignment geometry, in-plane alignment geometry was used.

For the in-plane alignment a ~10 μm thick layer was spread either by spin-coating or by plastic spatula over 1 cm×1 cm area of metal finger grid where the thickness and width of fingers, respectively, were 50-200 nm and 2-10 μm. The spacing between fingers was 10-100 μm.

Figure 5:
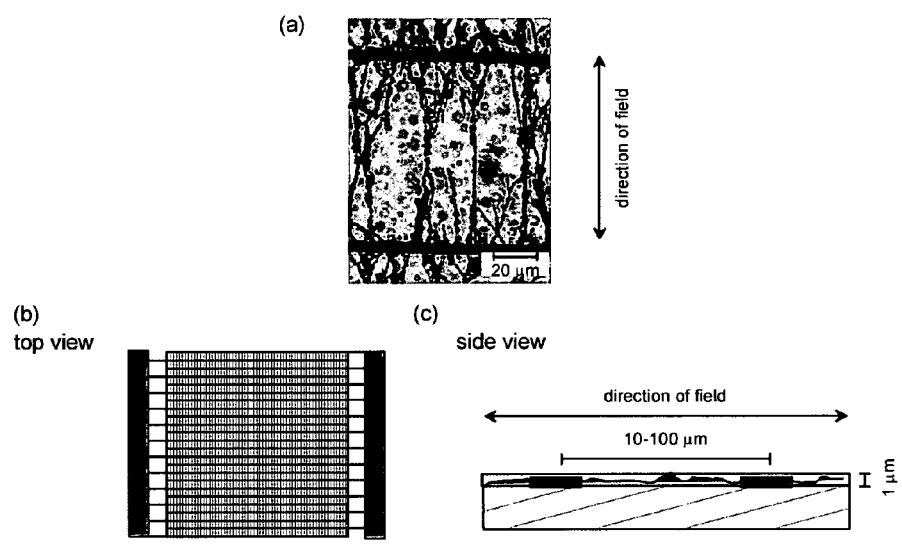

FIG. 5 illustrates aligned and cured conductive CNC adhesives in in-plane geometry. FIG. 5a shows an optical micrograph of 0.2 vol-% aligned material. Schematic (FIG. 5b) illustrates the alignment setting. In this geometry the alignment occurs typically in seconds or tens of seconds.

In another version the alignment electrodes were electrically insulated. Alignment was achieved exactly as without insulating layer.

Example 5

This example concerns versatile choice of alignment geometries and illustrates how the invention can be employed not only in the out-of-plane and in-plane geometries with flat well defined electrodes but also when the geometry and electrode shape is arbitrary. This example underlines the generality of the method. This also illustrates that the alignment does not require a surface or interface parallel to the emerging aligned pathways.

The materials were otherwise the same and the procedure similar as in examples 1, 2, 3, or 4 but instead of out-of-plane or in-plane alignment geometry and flat electrodes, arbitrary geometry and arbitrary electrode shape were used. FIG. 6 shows an optical micrograph of an aligned material when arbitrary geometry and arbitrary electrode shapes were used.

Example 6

This example concerns further versatility of the invention, the use of electric field alignment when preparing electrodes with very large contact area dendrimer surface.

The procedure was otherwise similar to that in examples 1, 2, 3, 4, or 5 but the alignment was terminated before the chains reached from electrode to electrode. FIG. 7 shows thus obtained electrodes with dendritic surface.

This can be used for making a film for use in batteries or capacitors.

Example 7

This example concerns the materials selection for the procedure described in example 1, 2, 3, 4, 5 or 6.

Polymeric material, including polyvinyl chloride resin, suitable for the described alignment process for flooring may be homopolymers, or copolymers, consisting of vinyl chloride and other structural units, such as vinyl acetate. To protect the polymeric material from degradation during processing and during its use as flooring material, vinyl compounds may be stabilized against the effects of heat and ultraviolet radiation, using e.g. soaps of barium, calcium and zinc; organo-tin compounds; epoxidized soy bean oils and tallate esters or organic phosphites.

Polymeric materials may contain plasticizers to provide flexibility and to facilitate processing. One suitable plasticizer is dioctyl phthalate (DOP). Others suitable ones may include butylbenzyl phthalate (BBP), alkylaryl phosphates, other phthalate esters of both aliphatic and aromatic alcohols, chlorinated hydrocarbons, and various other high boiling esters.

The stabilized and plasticized vinyl formulation is mixed with varying amounts of inorganic filler to provide mass, colour and thickness at a reasonable cost. The fillers may be calcium carbonate, talcs, clays and feldspars. White pigment can be titanium dioxide and coloured pigments are preferably inorganic.

Other additives can be used to avoid flame spread and smoke generation during a fire. These compounds include alumina trihydrate, antimony trioxide, phosphate or chlorinated hydrocarbon plasticizers, zinc oxide, and boron compounds. Cushioned flooring containing chemically expanded foam can be compounded with azobisformamide blowing agents. Various other processing aids and lubricants may also be employed.

The amount of filler can be less than 1% or up the 80% of the weight, whereas as vinyl resin, other resins, plasticizer and stabilizer can be less than 1% or amount to 20%.

Example 8

The procedure was otherwise similar to that in example 1, 2, 3, 4, 5 or 6 but the aligned material was used produce a top layer that is laminated with the flooring material.

Example 9

The procedure was otherwise similar to that in example 1, 2, 3, 4, 5 or 6 but the aligned material was used as a part of furniture or work-station.

Example 10

The procedure was otherwise similar to that in example 1, 2, 3, 4, 5 or 6 but the aligned material was used as a part of shoe or a gasket.

Example 11

The procedure was otherwise similar to that in example 1, 2, 3, 4, 5 or 6, but the aligned material was use as a part of packaging material.

Example 12

The procedure was otherwise similar to that in example 1, 2, 3, 4, 5 or 6 but the aligned material was use as a part of a battery or capacitor.

Example 13

The procedure was otherwise similar to that in example 1, 2, 3, 4, 5 or 6 but the aligned material was made into a sheet of up to 5 cm in thickness, preferably less than 1 cm in thickness and less than 10 m wide. Said sheet can then be stored and used in the production of large parts for use in vehicles, computers and printers, for example, by cutting or thermoforming.

The invention claimed is:

1. A method for manufacturing an ESD device having at least one anisotropic conductive or dissipative layer comprising a mixture of a nonconductive matrix and conductive particles, wherein the method comprises:
   a) applying a layer of the mixture over a first surface of the ESD device, the mixture having a first viscosity which allows the conductive particles to rearrange within the layer;
   b) applying an electric field between two alignment electrodes over the layer, so that a number of the conductive particles are aligned with the field, thus creating conductive pathways, wherein at least one of the electrodes is not in direct contact with the layer while the electric field is applied; and
   c) changing the viscosity of the layer to a second viscosity, said second viscosity being higher than the first viscosity in order to mechanically stabilize the layer and preserve the conductive pathways,
   wherein a concentration of the conductive particles in the layer is below the percolation threshold.

2. The method in accordance with claim 1, wherein the matrix comprises one or more polymers.

3. The method in accordance with claim 2, wherein the matrix is an adhesive.

4. The method in accordance with claim 1, wherein one of the alignment electrodes is in direct contact with the layer, while the electric field is applied.

5. The method in accordance with claim 1, wherein the alignment electrodes are insulated from the layer.

6. The method in accordance with claim 1, wherein the electric field is 0.05 to 0 kV/cm.

7. The method in accordance with claim 1, wherein the electric field is an AC field.

8. The method in accordance with claim 1, wherein the electric field is applied between the first surface and a second surface.

9. The method in accordance with claim 4, wherein the application of the electric field is stopped before the conductive pathway has connected the alignment electrodes.

10. The method in accordance with claim 1, further comprising totally or partly removing the matrix from the layer after c).

11. The method in accordance with claim 1, wherein the conductive particles comprise one or more of carbon black, carbon nanodiscs, carbon nanocones, metals, metal oxides and colloidal metal containing particles.

12. The method in accordance with claim 1, wherein the matrix is a thermoplastic resin which comprises one or more of polyurethane, polyvinyl chloride, polyolefins and copolymers of vinyl chloride and copolymers of olefins.

13. The method in accordance with claim 1, wherein the electrically conducting or dissipative layer has a thickness from 0.1-5 mm.

14. The method in accordance with claim 11, wherein the matrix is a thermoplastic resin which comprises one or more of polyurethane, polyvinyl chloride, polyolefins and copolymers of vinyl chloride and copolymers of olefins.

15. The method in accordance with claim 1, wherein the concentration of the conductive particles in the layer is 0.2-2 vol %.

16. The method in accordance with claim 1, wherein both of the two electrodes are not in direct contact with the layer while the electric field is applied.

17. The method in accordance with claim 1, wherein after the layer of the mixture has been applied over the first surface of the ESD device in a), the conductive particles are randomly distributed in the nonconductive matrix.

18. A method for manufacturing an ESD device having at least one anisotropic conductive or dissipative layer comprising a mixture of a nonconductive matrix and conductive particles, wherein the method comprises:
   a) applying a layer of the mixture over a first surface of the ESD device, the mixture having a first viscosity which allows the conductive particles to rearrange within the layer;
   b) applying an electric field between two alignment electrodes over the layer, so that a number of the conductive particles are aligned with the field, thus creating conductive pathways, wherein at least one of the electrodes is not in direct contact with the layer while the electric field is applied; and
   c) changing the viscosity of the layer to a second viscosity, said second viscosity being higher than the first viscosity in order to mechanically stabilize the layer and preserve the conductive pathways, wherein a concentration of the conductive particles in the layer is 0.2-2 vol %.

* * * * *